(12) United States Patent
Haas et al.

(10) Patent No.: US 8,323,412 B2
(45) Date of Patent: Dec. 4, 2012

(54) SUBSTRATE SUPPORT, SUBSTRATE PROCESSING DEVICE AND METHOD OF PLACING A SUBSTRATE

(75) Inventors: Dieter Haas, Bruchkoebel (DE); Thomas Berger, Norheim (DE); Simon Lau, Alzenau (DE)

(73) Assignee: Applied Materials, Inc., Santa Clara, CA (US)

( * ) Notice: Subject to any disclaimer, the term of this patent is extended or adjusted under 35 U.S.C. 154(b) by 1260 days.

(21) Appl. No.: 12/108,320

(22) Filed: Apr. 23, 2008

(65) Prior Publication Data

US 2008/0295773 A1   Dec. 4, 2008

Related U.S. Application Data

(60) Provisional application No. 60/914,553, filed on Apr. 27, 2007.

(30) Foreign Application Priority Data

Apr. 27, 2007   (EP) .................................... 07107164

(51) Int. Cl.
*C23C 16/00* (2006.01)
*B05C 13/00* (2006.01)
(52) U.S. Cl. ......... 118/728; 118/729; 118/503; 414/941
(58) Field of Classification Search ................... 118/728, 118/729, 503; 414/941
See application file for complete search history.

(56) References Cited

U.S. PATENT DOCUMENTS

| 5,471,279 | A | 11/1995 | Takizawa |
| 5,957,651 | A | 9/1999 | Takebayashi et al. |
| 5,989,342 | A | 11/1999 | Ikeda et al. |
| 6,033,480 | A | 3/2000 | Chen et al. |
| 6,106,631 | A | 8/2000 | Inoue et al. |
| 6,773,562 | B1 | 8/2004 | Inagawa et al. |
| 2003/0196604 | A1 | 10/2003 | Sidhwa |
| 2005/0117142 | A1 | 6/2005 | Heerens et al. |

FOREIGN PATENT DOCUMENTS

| EP | 0284003 A | 9/1988 |
| EP | 1998366 A1 | 4/2007 |
| JP | 05226214 A | 9/1993 |
| JP | 2000273626 | 10/2000 |
| JP | 2001192834 | 7/2001 |
| JP | 2005129959 | 5/2005 |
| JP | 2005223217 | 8/2005 |
| WO | WO 2005085492 | 9/2005 |
| WO | WO 2005087969 | 9/2005 |

*Primary Examiner* — Parviz Hassanzadeh
*Assistant Examiner* — Nathan K Ford
(74) *Attorney, Agent, or Firm* — Kilpatrick Townsend & Stockton LLP

(57) ABSTRACT

A substrate support for supporting a substrate in a processing chamber comprises a frame for carrying the substrate, at least a first fastening means fixedly attached to the frame for aligning the substrate relative to the frame, and at least a second fastening means movably attached to the frame, the second fastening means being movable relative to the frame and/or the substrate. Furthermore, a processing device comprises an edge exclusion projecting over a portion of the surface of the substrate in order to prevent processing of the portion of the surface of the substrate. A part of the edge exclusion may be moved into a gap between the edge(s) of the substrate and the frame element of the substrate support to form a labyrinth seal between the frame element and the edge of the substrate. A method of placing the substrate on the substrate support is also disclosed.

11 Claims, 3 Drawing Sheets

SUBSTRATE SUPPORT, SUBSTRATE PROCESSING DEVICE AND METHOD OF PLACING A SUBSTRATE

CROSS-REFERENCES TO RELATED APPLICATIONS

This application is a non-provisional of, and claims the benefit of the filing date of U.S. Provisional Patent Application No. 60/914,553, entitled "SUBSTRATE SUPPORT, SUPPORT PROCESSING DEVICE AND METHOD OF PLACING A SUBSTRATE," filed Apr. 27, 2007, the entire disclosure of which is incorporated herein by reference for all purposes.

This application also claims the benefit of the filing date of European Patent No. EP 07107164, entitled "SUBSTRATE SUPPORT, SUPPORT PROCESSING DEVICE AND METHOD OF PLACING A SUBSTRATE," filed Apr. 27, 2007, the entire disclosure of which is incorporated herein by reference for all purposes.

BACKGROUND OF THE INVENTION

The present invention relates to a substrate support for supporting a substrate to be processed in a vacuum processing chamber, the substrate support comprising a frame for carrying the substrate, and at least a first fastening means fixedly attached to the frame for aligning the substrate relative to the frame by attaching the substrate to the first fastening means. Furthermore, the invention relates to a substrate processing device for processing a substrate, the processing device comprising at least one process chamber, processing tools arranged in the process chamber for processing the substrate, and an edge exclusion projecting over a portion of the substrate surface of a substrate supported in a substrate support and received in the process chamber for preventing processing of a portion of the substrate. Moreover, the invention relates to a method of placing a substrate on a substrate support.

In the field of processing, e.g. coating, substantially large-size plane substrates, various processing methods are used, e.g. PVD (physical vapor deposition) like sputtering, CVD (chemical vapor deposition), PECVD (plasma enhanced chemical vapor deposition), etc. By applying these processes, single layers or multi-layer systems are deposited on glass substrates to produce coated panels, display screens, OLED (organic light emitting diode) panels, thermally insulating glass panels, etc.

Generally, the layer deposition may be provided in static or in dynamic coating processes. In static coating processes, the substrate is positioned on a substrate supporting platform to be coated within a vacuum coating chamber. The substrate is secured to a support platform within a deposition chamber by clamp springs or a clamp frame while being coated.

In order to prevent deposition of particles on the edge or on the underside of the substrate, the substrate holder may include an edge exclusion or shadow frame for preventing processing of a perimeter portion of the (upper) substrate surface. A particular shadow frame supported on a shadow frame support within the cavity of a processing chamber is disclosed in U.S. Pat. No. 6,773,562 B1, which is incorporated herein by reference for all purposes. By providing the shadow frame, processing gases and plasma are prevented from reaching the edge and the backside of the substrate.

In dynamic coating processes, the substrate is fixedly attached to a carrier in order to provide the transport and transfer of the substrate between the various handling and processing chambers. Usually, the carrier comprises a frame extending along the edge of the glass substrate. The glass substrate is fixed in the carrier by clamp springs. During the deposition of coating particles on the substrate, particles may also be deposited on the frame causing particle problems. Particularly, when the carrier is locked in, locked out and transported between various coating chambers, it may be heated up and cooled down at frequent intervals. Due to thermal expansions of the carrier, the glass substrate has no defined position relative to the carrier during the processing/coating steps.

A number of problems have been identified with respect to the handling and processing of large-size substrates. Particularly, in a static process, the transport of glass substrates is difficult and the substrate may be damaged, e.g., by displacement of the substrate arranged on the supporting platform when positioning and aligning the substrate. Furthermore, if the edge exclusion is not properly centered relative to the substrate during the processing steps, the amount of shadowing will be unequal and inexact. Particularly, when depositing a number of layers in different chambers, re-positioning of the substrate may be required after moving the substrate from one processing chamber into the next processing chamber.

In dynamic coating processes, an exact positioning of the substrate relative to the carrier (and possibly relative to a shadow frame) is difficult to maintain during the complete process.

BRIEF SUMMARY OF THE INVENTION

It is an object of the present invention to provide a substrate support and a coating device allowing an exact alignment of a glass substrate on the substrate support and preventing the deposition of particles on the substrate support.

This object is achieved by the provision of a substrate support, a substrate processing device, and a method of placing a substrate on a substrate support. The features of the substrate support and the processing device as well as the method are described in detail herein.

A substrate support for supporting a substrate to be processed in a vacuum processing chamber comprises a frame for carrying the substrate, and at least a first fastening means fixedly attached to the frame for aligning the substrate relative to the frame by attaching the substrate to the first fastening means. The substrate support further comprises at least a second fastening means movably attached to the frame, the second fastening means being movable relative to the frame and/or movable relative to the substrate attached to the first fastening means, particularly in a direction at least towards and/or away from and edge of the substrate attached to the first fastening means.

The substrate support may be a substrate carrier for supporting substrates to be transported through a number of processing chambers for processing the glass substrates, particularly for coating the glass substrates. The glass substrates are particularly large-area plane substrates. Fastening means are means for aligning a substrate, for providing reference points for positioning the substrate, for engaging a substrate with the fastening means, and/or for attaching or fixing a substrate in the fastening means.

The first and second fastening means may comprise a stopper for the abutment of the edge(s) glass substrate, at least one supporting area for supporting the glass substrate and a clamp spring for fixing the glass substrate. The clamp spring may be a flat spring, a compound spring, etc. The substrate may be fixed on the carrier and in contact with the carrier only through the fastening means. No support platform or support surface has to be provided.

Because of the mobility of the second fastening means, thermal movement occurring during the transport of the substrate through lock chambers, unlock chambers, process and treatment chambers may be compensated. Furthermore, by providing a combination of a fixed fastening means and a moveable fastening means, an exact positioning of the substrate may be obtained.

Particularly, the first fastening means comprises at least a first retainer and a second retainer. The first and second retainers may be arranged at a first frame element and a second frame element, respectively, near a reference corner of the frame of the carrier. The substrate may be positioned in a reference position by means of the first and second retainers in a horizontal plane within the positioning space enclosed by the frame of the carrier. Thus, the glass substrate is fixedly positioned relative to the perpendicularly aligned first and second frame elements of the carrier.

In one embodiment of the invention, the first fastening means is arranged on the frame to define a reference corner for retaining, aligning and/or fixedly attaching the substrate relative to the substrate support in a reference position. The carrier comprises a reference corner including means for aligning the substrate relative to the carrier frame. For example, a first fastening means may be provided including alignment and fixing means positioned at different sides of the reference corner. The alignment and fixing means comprise a retainer for receiving the substrate, e. g., for engagement of the substrate with the retainer, provide an abutment for the substrate to bring it into a defined position, and a fixing means which may be closed for fixing the substrate in the defined position. The fixing means may be designed to include clamp spring.

Particularly, the second fastening means comprises at least a third retainer and a fourth retainer. The third retainer and/or clamp and the fourth retainer and/or clamp may be arranged at a third frame element and a forth frame element, respectively. Particularly, the third and the fourth retainer and/or clamp are arranged at two sides of a corner which is arranged opposite to the reference corner defined by the first fastening means.

The first fastening means and the second fastening means may each comprise one, two or more retainers for engagement with the edge of the substrate. The first fastening means, e.g., the retainers of the first fastening means, are fixedly connected to a first and second frame element. The first and second frame elements define a corner which is a reference corner for the alignment of the substrate relative to the carrier. The second fastening means comprises a linear guide means such that the retainers positioned at a third and forth frame element of the carrier are capable of being moved relative to the edge of the substrate and/or relative to the third and fourth frame element, respectively. In this way, the retainers of the second fastening means may be engaged and disengaged with the respective edge of the substrate.

The second fastening means may be movably attached to the substrate support by means of a linear guide, particularly for guiding the retainer elements on a linear path relative to the frame and/or the edge of a substrate received in the first fastening means in a direction substantially perpendicular to the edge of the substrate. In this way, thermal expansion of the carrier may be compensated as well as production tolerances in the substrate size. The glass substrate may be positioned exactly relative to the frame of the carrier and (if provided) to an edge exclusion.

It may be noted that the first fastening means and/or the second fastening means or components thereof may also be displaceable in a direction parallel to the edge(s) of the adjusted substrate. Furthermore, the term "fixedly attached" does not exclude a configuration in which a fastening means is fixed to a frame element by appropriate fixing means.

The second fastening means especially comprises means for exerting a force in the direction towards the edge(s) of the substrate received in the first fastening means. The force exerted in the direction towards the edge(s) of the substrate may be an elastic force. It may be exerted by an elastic element, e.g., by one or more springs, particularly by pressure springs, provided in the linear guidance(s) of the retainer(s) and/or fixing means. The resulting force exerted on the substrate by the second fastening means is substantially directed at the reference corner in order to keep the substrate in a desired position defined by the first fastening means that is fixedly connected with the frame of the carrier. Furthermore, the linear guide means provide for a movement of the second fastening means towards the edge of the substrate and allow, against an elastic force applied by pressure springs integrated in the guide means, to retract the second fastening means from the edge of the substrate.

The problem is also solved by providing a substrate processing device for processing a substrate, the processing device comprising at least one process chamber, processing tools arranged in the process chamber for processing the substrate, and an edge exclusion projecting over a portion of the substrate surface of a substrate supported in a substrate support and received in the process chamber for preventing processing of a portion of the substrate. The edge exclusion is adapted to provide a labyrinth seal between an edge of the substrate and a frame element of the substrate support.

Particularly, the substrate processing device is a coating device for depositing a layer and/or a layer system of particular materials on the substrate surface. The process chamber may be a vacuum chamber having processing tools arranged therein. The processing tools comprise material sources that provide coating material to be deposited on the substrate surface. The coating device usually comprises a number of vacuum coating chambers and/or process chambers to perform a number of coating and/or processing steps on a substrate. As the invention is not limited to particular coating methods, the coating tools may comprise sputter material sources, PVD tools, CVD tools, PECVD equipment, etc.

The carrier/substrate support comprises a frame which defines and/or encloses a space. The space is somewhat larger than the area of the substrates to be processed. Therefore, a small gap having a width of a few millimeters is provided between the peripheral edge of the substrate and the frame elements defining the space. The gap may be covered by the edge exclusion.

The term "edge exclusion" is used as a synonym for the terms "shadow frame" or "masking." The inboard portion (lip portion) of the edge exclusion extends over a portion of the substrate surface masking a tab-like edge portion of the substrate surface, thereby forming a small clearance between the underside of the lip portion of the edge exclusion and the edge portion of the upper substrate surface. The lip portion projects inward from the body of the edge exclusion over the substrate edge. The width of the clearance may be constant or variable, e. g. having steps provided in the underside of the projecting lip portion of the edge exclusion.

A labyrinth seal in the sense of this invention is a seal which is structured to form a bent, a curve and/or a winding path between the upper surface of the substrate and components of the substrate support/carrier such that the probability for particles entering the clearance between the surface of the substrate and the underside of the edge exclusion is very small to reach the frame components (neither in a linear movement nor when being scattered). In other words, the particles have to pass through a long and difficult path to escape from the area of the coating chamber in which particles used for the process are provided.

According to the present invention, the labyrinth seal is formed as a part of the edge exclusion. The edge exclusion projects over portion of the surface of a substrate supported by a carrier/substrate support and received in the coating chamber in order to prevent processing of a portion of the substrate surface. A part of the edge exclusion may be moved into the gap between the edge(s) of the substrate and the frame of the substrate support to form the labyrinth seal between the frame element and the edge of the substrate.

The labyrinth seal is implemented by providing a protrusion formed at the edge exclusion. Particularly, the protrusion is provided to extend into the gap between the edge of the aligned substrate and the frame of the carrier when the edge exclusion is moved close to the carrier. The protrusion prevents particles entering the clearance between the underside of the edge exclusion and the upper surface of the glass substrate from passing the gap between the edge of the glass substrate and the carrier components. The protrusion blocks any linear path to the frame or any other component of the carrier for the particles entering the clearance.

The labyrinth seal is a non-contact sealing. Hence, there is no considerable "bridging" between the substrate and the frame elements. The only contact between the substrate and the carrier is made by the retainers of the fastening means, i.e., the substrate is exclusively supported by the first fastening means and the second fastening means which are in contact only with a small portion of the periphery of the substrate. Therefore, a defined masked tab around the periphery of the substrate may be provided, and bridging between the substrate and components of the carrier may be avoided.

Particularly, the substrate processing device further comprises a substrate support/carrier, particularly a substrate support as described above, for supporting a substrate. The substrate support may support a substrate and carry the substrate through a number of processing chambers, transfer chambers etc. in order to accomplish a substrate transfer and processing of the substrate. Furthermore, by providing the carrier according to the invention (particularly in a dynamic coating process), an exact alignment and positioning of the substrate relative to the carrier, and, if an edge exclusion is provided, relative to the edge exclusion is possible. Thus, a defined shadowed tab along the periphery of the substrate surface may be obtained. Coating of the carrier by scattered particles is reduced due to the provision of a labyrinth seal.

The substrate support may comprise a frame and a substrate supported in the substrate support, the frame being arranged such that a gap is formed between the frame and an edge of the substrate. In fact, the substrate support may be loaded with a substrate to form the gap which is covered by an edge exclusion.

Particularly, the edge exclusion is arranged within the process chamber. In one embodiment, the edge exclusion is coupled with at least a component of the process chamber, particularly with a chamber wall.

In this embodiment, the edge exclusion and the substrate support received in the process chamber are arranged movable relative to each other in order to move at least a portion of the edge exclusion into the gap between the edge of the substrate and the frame of the substrate support to form the labyrinth seal. The edge exclusion may be coupled with at least a component of the process chamber and arranged within the process chamber movable, e.g., relative to a chamber wall. Particularly, it may be movable relative to the substrate support arranged within the process chamber. A relative movement means that the edge exclusion may also be fixedly connected with at least a component of the process chamber, and the process chamber may provide means for moving the substrate support towards the edge exclusion. Also, both the edge exclusion and the substrate support may be arranged movable within the process chamber and be able to move towards each other and to move away from each other.

Particularly, the edge exclusion comprises a body portion for covering the gap between the edge of the substrate and the frame of the substrate support in order to prevent particles from entering into the gap.

The lip portion of the edge exclusion may comprise an end portion having a free end projecting over a portion of the substrate surface to form a clearance between the underside of the lip portion and the portion of the substrate surface. The free end portion of the lip portion projects over the portion of the substrate surface in a contactless manner.

The labyrinth seal may furthermore comprise a protrusion extending from the edge exclusion into the gap between the edge of the substrate and the frame element for preventing particles required for the process to pass the gap in a direction towards the frame element. A particle entering the clearance is blocked by the protrusion from moving further into the direction of the frame that surrounds the substrate, or into the direction of other components of the carrier. The protrusion extends into the gap along substantially the complete periphery of the edge of the substrate. Therefore, a labyrinth seal is provided substantially along the entire periphery of the substrate.

Because the protrusion protrudes downward from the underside of the lip projection over the peripheral portion of the substrate surface considerably further than the width of the clearance, a direct linear path to the frame is blocked by the protrusion. The protrusion is only interrupted at the positions of the fastening means retaining some small peripheral sections of the edge. The edge exclusion is movably arranged within the process chamber relative to the substrate support such that the protrusion is movable into the gap and retractable from the gap when the processing step has been finished. Thus, the substrate support/carrier can be easily transported into and out of the process chamber. The seal prevents particles used for processing the substrate surface from passing the gap entering the clearance in a direction towards the frame of the carrier.

A method of placing a substrate on a substrate support, particularly on a substrate support described above, comprises the steps of:

(a) providing at least a first fastening means fixedly attached to a frame of the substrate support, and a second fastening means movably attached to the frame, the second fastening means being movable relative to the frame;

(b) moving the second fastening means in an outward direction to increase a space defined by the position of the first fastening means and the second fastening means between the first fastening means and the second fastening means;

(c) attaching the substrate to the first fastening means;

(d) moving the second fastening means in an inward direction towards an edge of the substrate attached to the first fastening means; and (e) attaching the substrate to the second fastening means.

Particularly, step (c) includes retaining the substrate in the fastening means, moving the substrate towards abutments of the fastening means in order to adjust the position of the substrate, and locking the substrate in the first fastening means, e.g., by activating a clamp mechanism of the fastening means. Step (d) may include retaining the substrate in the fastening means, pressing the substrate in the direction of the first fastening means in order to stabilize the alignment of the substrate. Furthermore, in step (d) the fastening means may be moved in an inward direction by a force directed towards an edge of a substrate attached to the first fastening means.

In step (e) the second fastening means may exert a force towards the first fastening means so as to press the substrate in a direction of the first fastening means to maintain it in a position defined by the first fastening means.

In a further embodiment, attaching the substrate to the first fastening means and/or to the second fastening means is provided by closing a clamp spring of the first fastening means and the second fastening means, respectively, and/or by bringing an edge portion of the substrate into engagement with the first fastening means and the second fastening means, respectively.

When loading a carrier with a glass substrate, the following steps are carried out. First, the carrier is placed in a horizontal position. The clamp springs of the fastening means are opened. The movable retainers are removed against the force of the pressure springs provided in the linear guidance of the movable second fastening means, thereby increasing the space defined by the position of the first and second fastening means. Afterwards, the glass substrate can be received by the retainers of the first fastening means. The substrate is aligned by reference points in the first fastening means, e.g., by abutment surfaces, stoppers, etc. provided in the retainers of the first fastening means.

The substrate may be attached to the first and/or second fastening means by providing the fastening means with at least a clamp that may be opened and closed when removing the substrate from the fastening means and attaching the substrate to the fastening means, respectively. Before transporting the carrier into a process chamber, the clamp springs of the retainers are closed.

In another embodiment, the fastening means may comprise retainers that do not have an opening/closing mechanism. The substrate is attached to the fastening means by engaging the substrate with at least one retainer of the fastening means. The engagement is made by moving the substrate edge into the retainer. The disengagement is made by retracting the substrate from the retainer.

This means that in step (c) the substrate is moved in a space between the first fastening means and the second fastening means on a level appropriate for the engagement with the first fastening means. Afterwards, when the substrate has been attached to the first fastening means, the second fastening means is brought into engagement with the substrate by the movement of the second fastening means, particularly by retainers that are suitable for receiving a third and/or a fourth edge of the substrate.

Afterwards, the movable retainers of the second fastening means are released such that the elastic force exerted by the pressure springs of the guidance means make the retainers of the second fastening means move towards the third and fourth edge of the glass substrate until they abut on the respective edge of the glass substrate. The force of the pressure springs presses the glass substrate into the reference corner of the carrier.

Particularly, the first fastening means is placed in a reference corner of a frame of the substrate support, and the substrate is aligned by placing the substrate in a defined position determined by the first fastening means.

The first fastening means and the second fastening means may comprise at least two retainers and/or clamps each. The retainers and/or clamps of the first fastening means are fixed with respect to the frame of the carrier. They define a reference corner for aligning the substrate relative to the carrier. The retainers and/or clamps of the second fastening means, on the other hand, are movable to be able to move towards the substrate edge in order to engage with the substrate edge. By providing a linear guide means and an elastic means, the retainers of the second fastening means may exert a force towards the edge of the substrate, thus pressing the substrate into the direction of the reference corner.

The method may comprise a further step:
(f) moving an edge exclusion into a gap between the edge of the substrate and a frame element of the substrate support.

The general idea of the invention is to use a carrier for the transport of large-area glass substrates as well in a static as in a dynamic coating process. In order to ensure an exact aligning and positioning of glass substrate relative to the edge exclusion, a system for the alignment of the substrate on the carrier is integrated in the carrier. Furthermore, in order to prevent coating of the carrier more reliably, a labyrinth seal is used between the carrier components and the substrate edge.

In a static coating process, the edge exclusion is particularly integrated in the process chamber. The labyrinth seal is generated by moving a protrusion of the edge exclusion into a gap between the edge of the substrate and the carrier frame before starting the coating process.

In a dynamic coating process, the edge exclusion may be integrated in the carrier itself, i.e., it may be a component of the carrier. The labyrinth seal is provided by the arrangement of the protrusion of the edge exclusion in the gap between the edge of the substrate and the carrier frame.

Unloading the substrate from the carrier includes performing the steps of loading in reverse order. i.e., when removing the substrate from the substrate support, the second fastening means is moved outwards relative to the substrate in a direction away from an edge of the substrate. Afterwards, the substrate is removed from first fastening means, either by opening the clamp springs of the retainer, or by moving the substrate in a direction away from the first fastening means to release the substrate from the retainers.

The features described above are claimed in any combination thereof. Particularly, it has been recognized by the inventors that a combination of the inventive edge exclusion and the positioning mechanism for aligning and fixing the substrate results in a transportable substrate carrier that allows to maintain a permanently exact position of the substrate relative to the carrier, and an edge exclusion preventing the substrate carrier from being polluted by process particles effectively.

BRIEF DESCRIPTION OF THE DRAWINGS

Further objects and advantages result from the following description of specific embodiments relating to the figures.

DETAILED DESCRIPTION OF THE INVENTION

Figure 1:
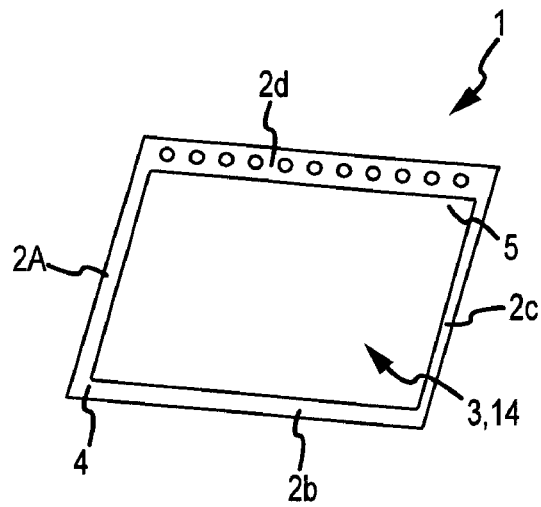
FIG. 1 is a view of a carrier according to the present invention.

FIG. 1 shows a substrate carrier 1 according to the present invention. The substrate carrier 1 comprises a frame 2 consisting of frame elements 2a, 2b, 2c and 2d defining and enclosing an interior space or area 3 for receiving a substrate 14. A substrate which is somewhat smaller than the interior space 3 may be positioned therein and held/fixed within the frame elements 2a, 2b, 2c, 2d.

The frame 2 has a first angular corner 4 defined by a first frame element 2a and a second frame element 2b, and an opposite second angular corner 5 defined by a third frame element 2c and a fourth frame element 2d.

Figure 2:
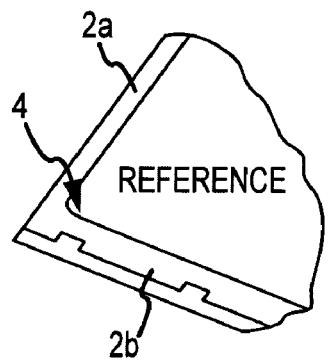
FIG. 2 is a detail view of the reference angular corner according to FIG. 1.

The first corner 4 is illustrated in detail in FIG. 2. The first corner 4 is called a reference corner due to the fact that it is provided for adjusting, positioning and fixing the substrate relative to the frame elements 2a and 2b, relative to the frame 2 and thus relative to the carrier 1.

Figure 3:
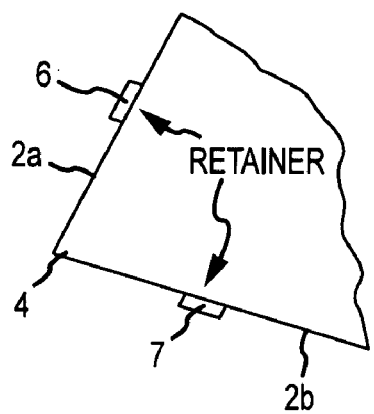
FIG. 3 is a detail view of FIG. 2 including retainers.

The first corner 4 comprises a first retainer 6 and a second retainer 7 fixedly attached to the first and second frame elements 2a and 2b, respectively, as illustrated in FIG. 3. In this way, a glass substrate may be positioned in a particular orientation relative to the frame elements 2a, 2b, 2c, 2d and the carrier 1.

Figure 4A:
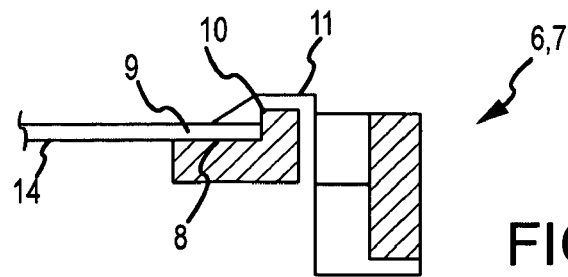
FIGS. 4A and 4B are two embodiments of retainers used in a carrier according to the present invention.
Figure 4B:
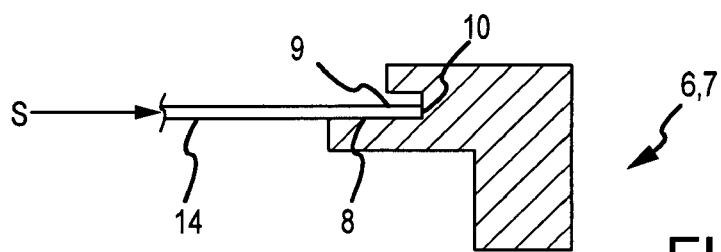

FIGS. 4A and 4B illustrate two embodiments of a retainer 6 or 7 used in the present invention. The retainer 6 or 7 comprises a supporting surface 8 for supporting a substrate 14. The substrate 14 inserted in a retainer gap 9 may be moved so far as to contact an abutment portion 10 of the retainer 6 or 7.

In one of the embodiments, a clamp spring 11 as shown in FIG. 4A is provided to fix the substrate 14 in a defined position after the adjustment of the substrate 14 in the reference corner 4. The clamp spring 11 may have an opening or closing mechanism.

In the alternative embodiment, the retainer 6, 7 may be constructed without an opening or closing mechanism as shown in FIG. 4B. The substrate is received and fixed in the retainer 6, 7 by inserting the substrate into the retainer gap 9 in a direction indicated by the arrow S and bringing it into engagement with the retainer 6 or 7.

Figure 5:
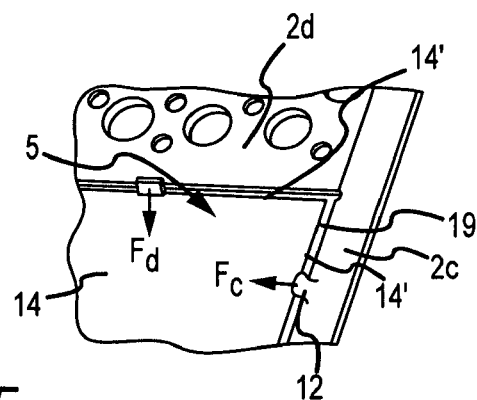
FIG. 5 is a detail view of the second angular corner including retainers according to FIG. 1.

FIG. 5 shows the second corner 5 of the carrier 1 illustrated in FIG. 1. The second angular corner 5 is defined by a third frame element 2c and a forth frame element 2d. Third and fourth retainers 12 and 13 are connected to the third frame element 2c and the forth frame element 2d, respectively. Basically, the retainers 12 and 13 have the same configuration as the retainers 6 and 7 illustrated in FIG. 4.

Figure 6:
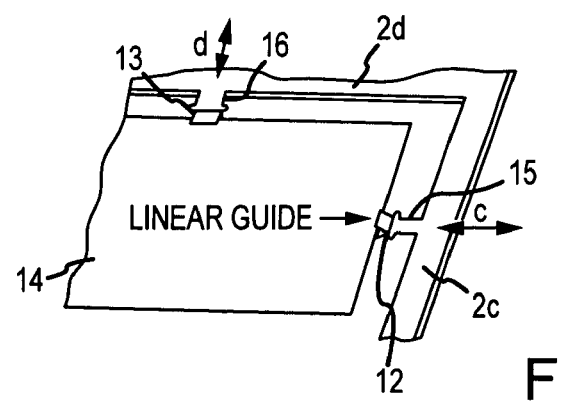
FIG. 6 is a detail view of FIG. 5 including both retainers and linear guides.

However, the third and fourth retainers 12 and 13 are not fixedly connected to the frame elements 2c and 2d, but movably relative to the respective frame elements 2c and 2d. This is indicated in FIG. 6. The third and the fourth retainers 12 and 13 are attached to the frame elements 2c and 2d, respectively, by means of linear guides 15 and 16. Therefore, the third and the fourth retainers 12 and 13 are movable relative to the frame elements/members 2c and 2d, respectively, in the direction indicated by arrows c and d in FIG. 6. The direction is substantially perpendicular to the longitudinal axis of the third and fourth frame members 2c and 2d, respectively, and/or substantially perpendicular to the edge(s) of a substrate inserted and positioned in the first and second retainers 6 and 7.

A substrate 14 held by the retainers 12 and 13 may thus conduct movements relative to the frame elements 2c and 2d. Consequently, thermal expansion of the carrier 1 may be compensated by the movement of the retainers 12 and 13 by means of linear guides 15 and 16 relative to the third and fourth frame members 2c and 2d.

Figure 7:
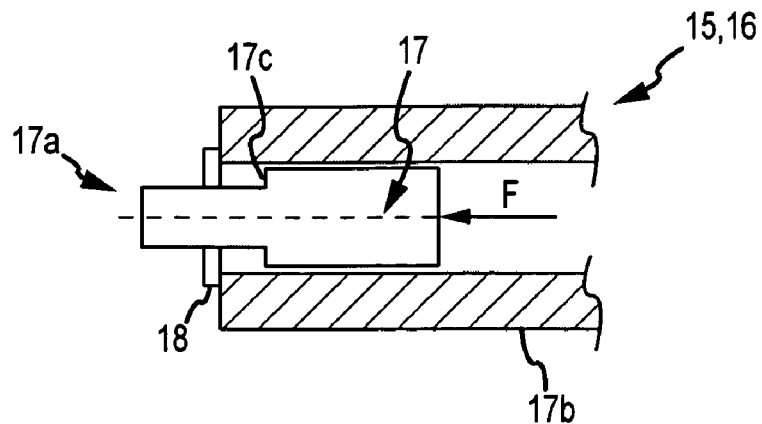
FIG. 7 is a view of the linear guide of FIG. 6 in accordance with the present invention.

A linear guide 15 or 16 as used in the present invention is shown in FIG. 7. It comprises an attachment portion 17a provided on a telescopic member 17 for fixing a retainer 12, 13 thereon. The movable member 17 is guided by a linear bearing 17b. The movable member 17 performs the linear movement within the bearing 17b. A stopper 18 restricts the movement of the movable member 17 in the direction F by contacting an abutment surface 17c of the movable member 17.

Furthermore, an elastic element (not shown), e.g., a pressure spring, is provided in a conventional manner such that a force indicated by arrow F, is exerted in the direction of an edge of the substrate 14 (see FIGS. 5 and 6). Due to the arrangement of the retainers 15 and 16 in the opposite corner 5, the force resulting from the forces $F_c$ and $F_d$ provided by the elastic elements of the linear guides 15, 16 urges the substrate 14 in the direction of the reference corner 4 and thus provides a secure and exact position of the substrate in the reference corner 4 (see FIG. 1). Therefore, the position of the substrate 14 relative to the first and second frame elements 2a and 2b is continuously the same regardless of thermal expansions of the carrier 1, production tolerances of the substrate size, and other variations of the substrate size.

The carrier 1 described in FIG. 1 may be used for dynamic or static coating processes. Particularly in static coating processes, an edge exclusion 20 may be used in combination with the carrier 1 as shown in FIG. 8.

The edge exclusion 20 is movably installed inside a vacuum chamber. It may be moved in a direction indicated by an arrow M and in the opposite direction relative to the frame 2 and substrate 14. Alternatively, the frame 2 and substrate 14 may be moved relative to the edge exclusion 20. In a first retracted position (not shown), the edge exclusion 20 is spaced from the frame 2 of the carrier 1 such that a protrusion 20c does not engage with the gap 19 between the outer edge 14' of a substrate 14 and the inner edge 2' of the frame 2 of the carrier 1. In this position of the edge exclusion 20, the carrier 1 is positioned within the vacuum chamber. Before the static coating process is started, the edge exclusion 20 is moved in the direction M towards the frame 2 in order to bring the edge exclusion 20 in a second position (as shown in FIG. 8), thus bringing the protrusion 20c into exact engagement with the gap 19. Then, the static coating process may be carried out. In the second position, the edge exclusion 20 covers the gap 19 (see FIG. 5) between the outer edge of the substrate 14 and the frame elements 2a, 2b, 2c and 2d.

In another embodiment, particularly in connection with a dynamic coating process, the edge exclusion 20 may be fixed to the carrier 1 to be moved through the processing stations together with the carrier 1.

Figure 8:
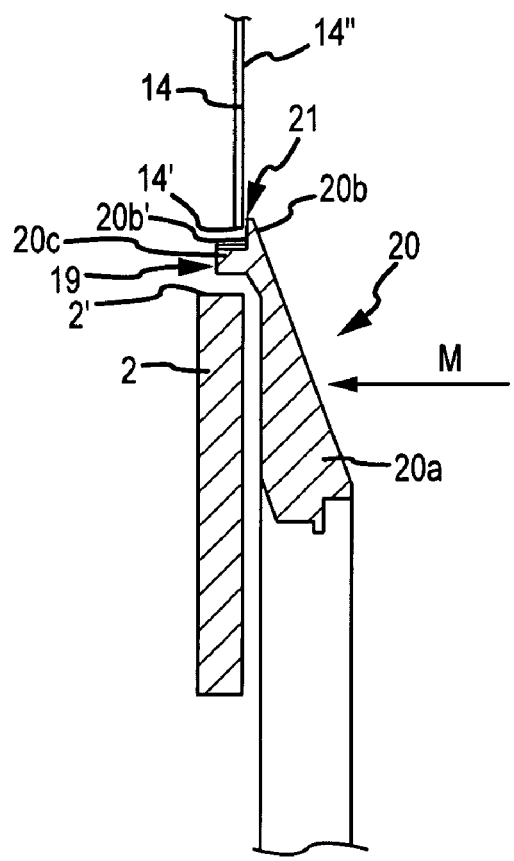
FIG. 8 is a view of an edge exclusion provided in accordance with the present invention.

According to FIG. 8, the edge exclusion 20 comprises a body portion 20a, a lip/end portion 20b having a free end and a protrusion 20c extending into the gap 19 between the outer edge 14' of a substrate 14 and the inner edge 2' of a frame 2 of the carrier 1. The protrusion 20c may extend into the gap 19 to an appropriate extent such that unwanted particle contamination of carrier components is prevented.

The body portion 20a substantially extends over the frame 2 and over the gap 19 along the substantially entire periphery of the edge 14' of the substrate 14 in order to prevent particles from entering into the gap 19 and being deposited on the frame 2.

The lip portion 20b has a free end projecting over a portion of the substrate surface substantially along the periphery near the edge 14' of the substrate 14. The lip portion 20b is thus the shield or mask for preventing coating particles from being deposited in the outer edge region of the upper substrate surface 14", on the outer edge 14' and on the underside of the substrate 14.

The underside 20b of the lip portion 20b of the edge exclusion 20 and a portion of the upper substrate surface 14" near the edge 14' of the substrate 14 form a clearance 21 having an adjustable width. On one hand, the width is set large enough for preventing "bridging" between the edge exclusion 20 and the substrate 14, on the other hand, the width is small enough to shield a portion o the substrate surface near the edge 14', the edge 14' and the underside of the substrate 14 effectively from particle deposition by particles entering into the clearance 21. Such a clearance 21 allows the free end of the lip portion 20b to project over the portion of the substrate surface 14" in a contactless manner.

The protrusion 20c extending into the gap 19 provides a labyrinth seal for particles entering the clearance 21. The protrusion 20c is formed to prevent particles entering into the clearance 21 to be deposited on the frame 2 by blocking the particles on their (direct) way to the frame 2. Particularly, the protrusion 20c protrudes downward from the underside of the lip portion over the peripheral portion of the substrate surface considerably further than the width of the clearance, such that a direct linear path to the frame is blocked by the protrusion. Thus, the coating particles are exclusively deposited on the substrate surface and on the edge exclusion 20.

Due to the exact positioning of the substrate 14 relative to the frame 2, the protrusion 20c of the edge exclusion 20 (mask) may be moved exactly into the gap 19. This provides for constant conditions during a number of coating processes carried out in the vacuum chamber. Furthermore, any pollution of the carrier components may be prevented, even when the process chamber is vented (causing particles to be detached from components arranged inside the vacuum chamber).

The combination of the positioning method and device for attaching the substrate to the carrier 1 in a defined position and the edge exclusion 20 as described above provides for a secure, exact and permanent positioning of the substrate 14 relative to frame elements 2a, 2b and relative to the edge exclusion 20. Furthermore, any pollution of the carrier components by particles used for processing the substrate 14 is prevented. By using the described edge exclusion 20, a defined tab on the substrate surface can be masked and particles can be prevented from polluting carrier components. Because of the advantages in positioning the substrate 14, thermal expansion of the carrier 1 may be compensated and the quality of the coating near the edges 14' of the substrates 14 may be improved.

What is claimed is:

1. A substrate processing device for processing a substrate comprising:
    at least one process chamber;
    processing tools arranged in the process chamber for processing the substrate;
    a substrate support having a frame and being received in the process chamber for supporting the substrate; and
    an edge exclusion projecting over a portion of the surface of the substrate for preventing processing of a portion of the substrate, wherein the edge exclusion is adapted to provide a labyrinth seal between an edge of the substrate and a frame element of the substrate support, wherein the labyrinth seal comprises at least a protrusion extending from a body portion of the edge exclusion, wherein the edge exclusion is movably arranged within the process chamber relative to the substrate support such that the protrusion is movable into a gap between the edge of the substrate and the frame element;
    at least a first fastening means fixedly attached to the frame for aligning the substrate relative to the frame by attaching the substrate to the first fastening means; and
    at least a second fastening means movably attached to the frame, the second fastening means being movable relative to the frame and/or movable relative to the substrate attached to the first fastening means.

2. The substrate processing device according to claim 1, wherein the edge exclusion and the substrate support received in the process chamber are arranged movable relative to each other in order to move at least a portion of the edge exclusion into the gap between the edge of the substrate supported by the substrate support and the frame element of the substrate support to form the labyrinth seal.

3. The substrate processing device according to claim 1, wherein the body portion of the edge exclusion covers the gap between the edge of the substrate and the frame element of the substrate support in order to prevent particles from entering into the gap.

4. The substrate processing device according to claim 1, wherein the edge exclusion comprises an end portion having a free end projecting over a portion of the substrate surface to form a clearance between the underside of the end portion of the edge exclusion and the portion of the upper substrate surface.

5. The substrate support according to claim 1, wherein the second fastening means is movable in a direction at least towards and/or away from the edge of the substrate attached to the first fastening means.

6. The substrate processing device according to claim 1, wherein the first fastening means comprises at least a first retainer element and a second retainer element.

7. The substrate processing device according to claim 1, wherein the first fastening means is arranged on the frame to define a reference corner for retaining, aligning and/or fixedly attaching the substrate relative to the substrate support in a reference position.

8. The substrate processing device according to claim 1, wherein the second fastening means comprises at least a third retainer element and a fourth retainer element.

9. The substrate processing device according to claim 8, wherein the second fastening means is movably attached to the substrate support by means of a linear guide for guiding the retainer elements on a linear path relative to the frame and/or relative to the edge of the substrate received in the first fastening means in a direction substantially perpendicular to the edge of the substrate.

10. The substrate processing device according to claim 1, wherein the second fastening means comprises means for exerting a force in the direction towards the edge(s) of the substrate received in the first fastening means.

11. The substrate processing device according to claim 1, wherein the edge exclusion is arranged within the process chamber.

* * * * *